(12) United States Patent
Maki

(10) Patent No.: US 10,700,690 B2
(45) Date of Patent: *Jun. 30, 2020

(54) TIMING SIGNAL GENERATION DEVICE, ELECTRONIC DEVICE, AND MOVING OBJECT

(71) Applicant: Seiko Epson Corporation, Tokyo (JP)

(72) Inventor: Yoshiyuki Maki, Suwa (JP)

(73) Assignee: Seiko Epson Corporation (JP)

( * ) Notice: Subject to any disclaimer, the term of this patent is extended or adjusted under 35 U.S.C. 154(b) by 93 days.

This patent is subject to a terminal disclaimer.

(21) Appl. No.: 15/955,174

(22) Filed: Apr. 17, 2018

(65) Prior Publication Data

US 2018/0234100 A1 Aug. 16, 2018

Related U.S. Application Data

(63) Continuation of application No. 15/160,160, filed on May 20, 2016, now Pat. No. 9,979,409.

(30) Foreign Application Priority Data

May 27, 2015 (JP) .................................. 2015-107644

(51) Int. Cl.
*H03L 7/26* (2006.01)
*G01S 19/23* (2010.01)
(Continued)

(52) U.S. Cl.
CPC ............... *H03L 7/26* (2013.01); *G01S 19/23* (2013.01); *G01S 19/39* (2013.01); *H03L 1/04* (2013.01); *H03L 7/093* (2013.01)

(58) Field of Classification Search
CPC ... H03L 7/26; H03L 1/04; H03L 7/093; G01S 19/23; G01S 19/39
(Continued)

(56) References Cited

U.S. PATENT DOCUMENTS

| 6,928,275 B1 | 8/2005 | Patrick et al. |
| 8,344,770 B2 | 1/2013 | Fukuda |

(Continued)

FOREIGN PATENT DOCUMENTS

| JP | 2002-217713 A | 8/2002 |
| JP | 2004-514877 A | 5/2004 |

(Continued)

*Primary Examiner* — Arnold M Kinkead
(74) *Attorney, Agent, or Firm* — Harness, Dickey & Pierce, P.L.C.

(57) ABSTRACT

A timing signal generation device includes a GPS receiver, an atomic oscillator, a phase comparator, a frequency abnormality determination unit, a sensor unit, and a determination unit. The GPS receiver outputs 1 PPS. The atomic oscillator 30 outputs a clock signal for synchronization with 1 PPS. The phase comparator compares 1 PPS and the clock signal in phase. The frequency abnormality determination unit determines whether or not the frequency of the clock signal is abnormal, by using a comparison result of the phase comparator, and outputs frequency abnormality information including a determination result. The sensor unit detects environment information which has an influence on the comparison result. The determination unit determines a cause of the abnormality by using the frequency abnormality information and the environment information.

20 Claims, 5 Drawing Sheets

(51) Int. Cl.
*H03L 7/093* (2006.01)
*H03L 1/04* (2006.01)
*G01S 19/39* (2010.01)

(58) Field of Classification Search
USPC ....... 331/3, 94.1, 16, 176, 18; 342/286, 386, 342/454
See application file for complete search history.

(56) References Cited

U.S. PATENT DOCUMENTS 9,979,409 B2 * 5/2018 Maki .................. H03L 7/26
2016/0065215 A1 3/2016 Shin et al.

FOREIGN PATENT DOCUMENTS

| | | |
|---|---|---|
| JP | 2010-200047 A | 9/2010 |
| JP | 2011-155367 A | 8/2011 |
| JP | 2014-165508 A | 9/2014 |

* cited by examiner

TIMING SIGNAL GENERATION DEVICE, ELECTRONIC DEVICE, AND MOVING OBJECT

CROSS REFERENCE TO RELATED APPLICATIONS

This application is a continuation of U.S. patent application Ser. No. 15/160,160 filed on May 20, 2016, which claims priority to Japanese Patent Application No. 2015-107644 filed on May 27, 2015, both of which are hereby expressly incorporated by reference herein in their entireties.

BACKGROUND

1. Technical Field

The present invention relates to a timing signal generation device, an electronic device, and a moving object.

2. Related Art

A global positioning system (GPS) is one of global navigation satellite systems (GNSS) using a satellite. An atomic clock having significantly high precision is mounted in a GPS satellite used in the GPS. A satellite signal on which orbit information, accurate time information, or the like of a GPS satellite is superimposed is transmitted to the ground. The satellite signal transmitted from the GPS satellite is received by a GPS receiver. The GPS receiver performs processing of calculating the current position or the current time information of the GPS receiver, processing of generating an accurate timing signal (1 PPS) synchronized with the coordinated universal time (UTC), or the like based on the orbit information or the time information superimposed on the satellite signal. The precision of 1 PPS depends on precision of position information of a reception point to be set, and thus, it is important to set accurate position information in the GPS receiver.

For example, a reference frequency generation device disclosed in JP-A-2011-155367 includes a GPS receiver, a rubidium oscillator, and a crystal oscillator. When the rubidium oscillator is operated normally, an output signal of the rubidium oscillator is synchronized with a reference signal (1 PPS) received by the GPS receiver, and is output as a reference frequency signal by using a first PLL circuit which includes the rubidium oscillator. When the rubidium oscillator is not operated normally, an output signal of the crystal oscillator is synchronized with a reference signal (1 PPS) received by the GPS receiver, and is output as a reference frequency signal by using a second PLL circuit which includes the crystal oscillator.

Here, in the reference signal generation device disclosed in JP-A-2011-155367, when a phase difference between the output signal of the rubidium oscillator and the reference signal is outside of a predetermined range, it is determined that the rubidium oscillator fails, and switching of the above-described PLL circuit is performed. In such a device, it is possible to detect frequency abnormality of the output signal, such as so-called frequency shift or frequency jump, in the rubidium oscillator.

However, in the reference signal generation device disclosed in JP-A-2011-155367, the cause of the frequency abnormality in the output signal of the rubidium oscillator is not recognized. Thus, there is a problem in that efficiency of work such as maintenance or repair is deteriorated.

SUMMARY

An advantage of some aspects of the invention is that a timing signal generation device which can recognize a cause of frequency abnormality, and thus improve efficiency of work such as maintenance or repair, is provided, and that an electronic device and a moving object which include the timing signal generation device are provided.

The invention can be implemented as the following forms or application example.

Application Example 1

A timing signal generation device according to this application example includes a reference-timing signal output unit, an oscillator, a phase comparator, a frequency abnormality determination unit, a sensor unit, and a determination unit. The reference-timing signal output unit outputs a reference timing signal. The oscillator outputs a clock signal for synchronization with the reference timing signal. The phase comparator compares the reference timing signal and the clock signal in phase. The frequency abnormality determination unit determines whether or not the frequency of the clock signal is abnormal, by using a comparison result of the phase comparator, and outputs frequency abnormality information including a determination result. The sensor unit detects environment information. The determination unit determines a cause of the abnormality by using the frequency abnormality information and the environment information.

According to such a timing signal generation device, it is possible to recognize a cause of the abnormality in the clock signal of the oscillator, and as a result, it is possible to improve efficiency of work such as maintenance or repair. Here, "comparison of phase between the reference timing signal and the clock signal" also includes a case of comparing a phase of the reference timing signal output from the reference-timing signal output unit, and a phase of a clock signal divided from the clock signal which has been output from the oscillator.

Application Example 2

In the timing signal generation device according to the application example, it is preferable that the oscillator is an atomic oscillator.

The atomic oscillator is excellent in long-term stability, in comparison to a crystal oscillator. Thus, for example, even when using of the atomic oscillator causes an output of the reference timing signal by the reference-timing signal output unit to be not possible, it is possible to output a signal having high precision, by causing the atomic oscillator to perform self-running.

Application Example 3

In the timing signal generation device according to the application example, it is preferable that the atomic oscillator oscillates based on energy transition in a metal atom which has two ground levels different from each other, the sensor unit includes a microwave receiver that enables detection of a microwave having a frequency which corresponds to an energy difference between the two ground levels, and the environment information includes information regarding the microwave.

If a microwave having a frequency corresponding to an energy difference between two ground levels is input as disturbance, so-called frequency jump easily occurs in the atomic oscillator. For example, generally, in the timing signal generation device, a plurality of atomic oscillators is provided, and robust characteristics are improved by switching the plurality of atomic oscillators, if necessary. In such a case, a microwave due to an output signal of another atomic oscillator may be input to the atomic oscillator in the process of being used, and frequency jump may occur. Thus, it is possible to cause the determination unit to determine that the frequency jump occurring due to the microwave is included as the cause of the frequency abnormality, by using a detection result of such a microwave.

Application Example 4

In the timing signal generation device according to the application example, it is preferable that the sensor unit includes a resonance sensor that enables detection of resonance received by the oscillator, and the environment information includes information regarding the resonance.

If resonance is input as disturbance, frequency jump easily occurs in the oscillator. Thus, it is possible to cause the determination unit to determine that the frequency jump occurring by the resonance is included as the cause of the frequency abnormality, by using a detection result of such a resonance.

Application Example 5

In the timing signal generation device according to the application example, it is preferable that the sensor unit includes a power noise sensor that enables detection of a power noise, and the environment information includes information regarding the power noise.

If a power noise is input as disturbance, a frequency jump easily occurs in the oscillator. Thus, it is possible to cause the determination unit to determine that the frequency jump occurring by the power noise is included as the cause of the frequency abnormality, by using a detection result of such a power noise.

Application Example 6

In the timing signal generation device according to the application example, it is preferable that the sensor unit includes a temperature sensor that enables detection of the temperature of the oscillator, and the environment information includes information regarding the temperature.

Generally, the oscillator has temperature characteristics, and controls correction of the temperature characteristics. However, for example, if an environmental temperature is rapidly changed, the correction is not suitably applied, and thus the frequency jump easily occurs. Thus, it is possible to cause the determination unit to determine that the frequency jump occurring by the environmental temperature is included as the cause of the frequency abnormality, by using a detection result of such an environmental temperature.

Application Example 7

It is preferable that the timing signal generation device according to the application example further includes an output unit that outputs a determination result of the determination unit.

With this configuration, it is possible to improve efficiency of work, such as maintenance or repair, by displaying the determination result of the determination unit or transmitting the determination result to other devices.

Application Example 8

In the timing signal generation device according to the application example, it is preferable that the reference-timing signal output unit is a GPS receiver.

With this configuration, it is possible to use an accurate reference timing signal (1 PPS) synchronized with the coordinated universal time (UTC).

Application Example 9

An electronic device according to this application example includes the timing signal generation device according to the application example.

According to such an electronic device, it is possible to recognize a cause of frequency abnormality in the oscillator which is included in the timing signal generation device, and to improve efficiency of work, such as maintenance or repair.

Application Example 10

A moving object according to this application example includes the timing signal generation device according to the application example.

According to such a moving object, it is possible to recognize a cause of frequency abnormality in the oscillator which is included in the timing signal generation device, and to improve efficiency of work, such as maintenance or repair.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a timing signal generation device, an electronic device, and a moving object according to the invention will be described in detail, based on an embodiment illustrated in the accompanying drawings.

1. Timing Signal Generation Device

Figure 1:
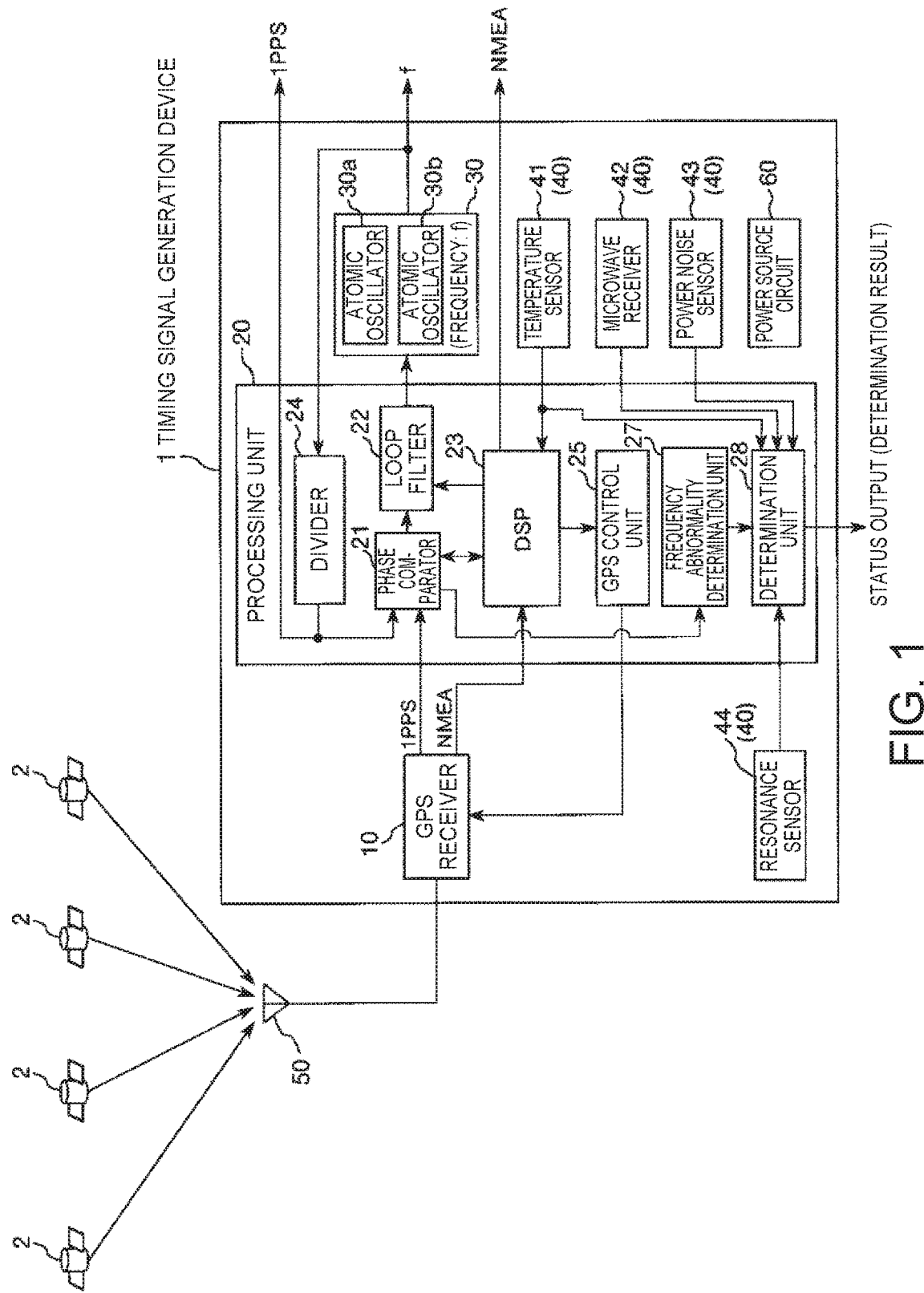
FIG. 1 is a schematic diagram illustrating a configuration of a timing signal generation device according to an embodiment of the invention.

FIG. 1 is a schematic diagram illustrating a configuration of the timing signal generation device according to an embodiment of the invention.

The timing signal generation device 1 illustrated in FIG. 1 includes a GPS receiver 10 (reference-timing signal output unit), a processing unit (CPU) 20, an atomic oscillator 30 (oscillator), a temperature sensor 41, a microwave receiver 42, a power noise sensor 43, a resonance sensor 44, a GPS antenna 50, and a power source circuit 60.

Some or all of the components of the timing signal generation device 1 may be physically separated or may be integrated. For example, each of the GPS receiver 10 and the processing unit (CPU) 20 may be realized by using an individual IC. The GPS receiver 10 and the processing unit (CPU) 20 may be realized as a one-chip IC.

The timing signal generation device 1 receives a signal transmitted from a GPS satellite (an example of a position information satellite) 2, and generates 1 PPS with high precision.

The GPS satellite 2 revolves on a predetermined orbit over the Earth and transmits a satellite signal to the ground. The satellite signal is obtained by superimposing a navigation message and a C/A (coarse/acquisition) code on a radio wave (L1 wave) of 1.57542 GHz serving as a carrier wave (by modulating the carrier wave).

The C/A code is used for identifying satellite signals of GPS satellites 2 of which the number is currently about 30. The C/A code has a unique pattern formed from 1023 chips (cycle of 1 ms) of which each has a value of either of +1 and −1. Accordingly, correlation between the satellite signal and the pattern of the C/A code is obtained, and thus, it is possible to detect a C/A code superimposed on the satellite signal.

The satellite signal (specifically, navigation message) transmitted by each of the GPS satellite 2 includes orbit information indicating a position of the corresponding GPS satellite 2 on an orbit thereof. Each of the GPS satellites 2 has an atomic clock mounted therein and the satellite signal includes very precise time information clocked by the atomic clock. Accordingly, satellite signals are received from four or more GPS satellites 2, positioning calculation is performed by using orbit information and time information which are included in each of the received satellite signals, and thus it is possible to obtain accurate information about a position and a point of time of a reception point (installation place of the GPS antenna 50). Specifically, a quartic equation in which a three-dimensional position (x, y, z) of the reception point and a point t of time functions as four variables may be established and the solution thereof may be obtained.

In a case where the position of a reception point is already known, satellite signals may be received from one GPS satellite 2 or more, and time information at the reception point may be obtained by using time information included in each of the satellite signals.

Information about a difference between a point of time in each of the GPS satellites 2 and a point of time at the reception point may be obtained by using orbit information included in each of the satellite signals. A control segment on the ground measures a small time error of the atomic clock mounted in each of the GPS satellites 2, and the satellite signal also includes a time correction parameter for correcting the time error. Accordingly, a point of time at the reception point is corrected by using the time correction parameter, and thus very precise time information may be obtained.

The GPS antenna 50 is an antenna that receives various radio waves including the satellite signal. The GPS antenna 50 is connected to the GPS receiver 10.

The GPS receiver 10 (an example of a satellite signal reception unit) performs various types of processing based on the satellite signal received through the GPS antenna 50.

Specifically, the GPS receiver 10 has a normal positioning mode (an example of a first mode) and a position fixed mode (an example of a second mode). Either of the normal positioning mode and the position fixed mode is set in accordance with a control command (control command for setting a mode) from the processing unit (CPU) 20.

The GPS receiver 10 functions as "a positioning calculation unit" in the normal positioning mode. The GPS receiver 10 receives satellite signals transmitted from a plurality (preferably, 4 or more) of GPS satellites 2, and performs positioning calculation based on orbit information (specifically, the ephemeris data, the almanac data, or the like which is described above) included in the received satellite signal, and time information (specifically, the week number data, the Z count data, or the like which is described above). The normal positioning mode is a mode in which the positioning calculation is continuously performed.

In the position fixed mode, the GPS receiver 10 functions as "the reference-timing signal output unit" that outputs a reference timing signal. The GPS receiver 10 receives satellite signals transmitted from at least one GPS satellite 2, and generates 1 pulse per second (1 PPS) as a reference timing signal, based on orbit information and time information which are included in the received satellite signals, and position information of the reception point which has been set. 1 PPS (an example of a reference timing signal synchronized with the reference point of time) is a pulse signal which has been completely synchronized with the coordinated universal clock (UTC) and includes one pulse for each second. In this manner, the satellite signal used in generation of a reference timing signal by the GPS receiver 10 includes the orbit information and the time information, and thus a timing signal which is precisely synchronized with the reference point of time can be generated. The position fixed mode is a mode in which 1 PPS is output based on preset position information.

Next, a configuration of the GPS receiver 10 will be described in detail.

Figure 2:
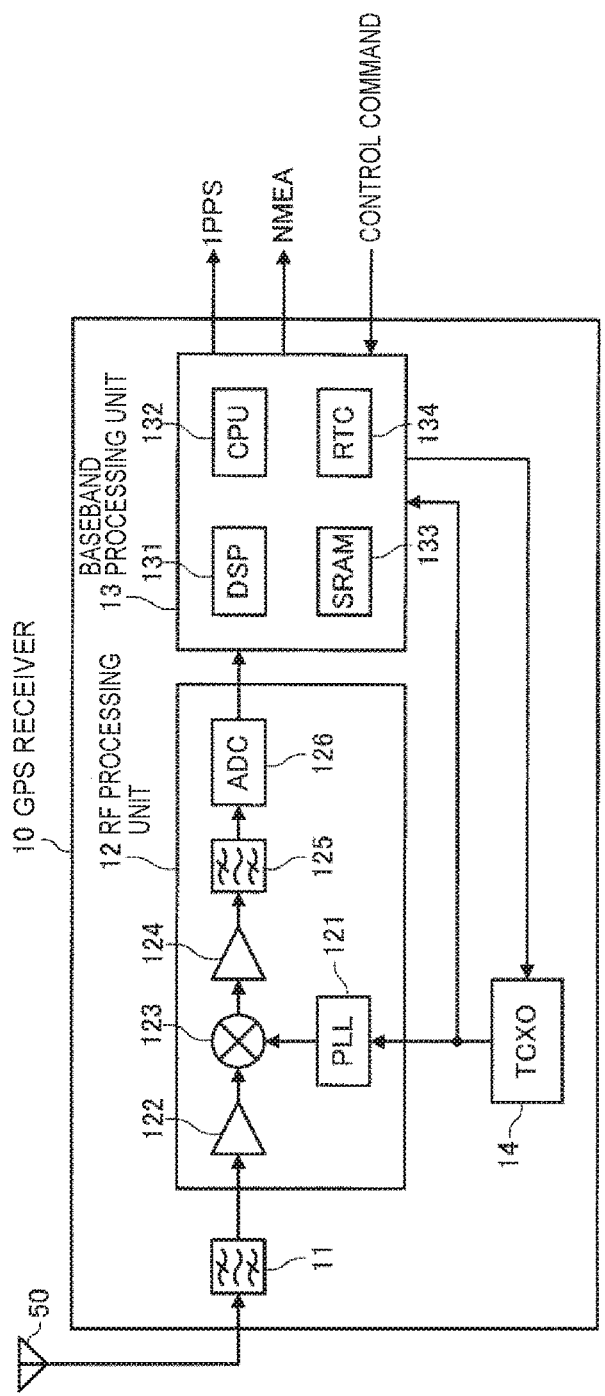
FIG. 2 is a block diagram illustrating a configuration example of a GPS receiver which is included in the timing signal generation device illustrated in FIG. 1.

FIG. 2 is a block diagram illustrating a configuration example of the GPS receiver which is included in the timing signal generation device illustrated in FIG. 1.

The GPS receiver 10 illustrated in FIG. 2 includes a surface acoustic wave (SAW) filter 11, a RF processing unit 12, a baseband processing unit 13, and a temperature compensated crystal oscillator (TCXO) 14.

The SAW filter 11 performs processing of extracting a satellite signal from a radio wave received by the GPS antenna 50. The SAW filter 11 is configured as a bandpass filter through which a signal in a band of 1.5 GHz passes.

The RF processing unit 12 includes a phase locked loop (PLL) 121, a low noise amplifier (LNA) 122, a mixer 123, an IF amplifier 124, an intermediate frequency (IF) filter 125, and an A/D converter (ADC) 126.

The PLL 121 generates a clock signal obtained by multiplying an oscillation signal of the TCXO 14, which is oscillated at about tens of MHz so as to have a frequency of 1.5 GHz.

The LNA 122 amplifies the satellite signal extracted by the SAW filter 11. The mixer 123 mixes the satellite signal amplified by the LNA 122 with the clock signal output by the PLL 121, and thus the amplified satellite signal is down-converted into a signal (IF signal) in an intermediate frequency band (for example, several MHz). The signal obtained by mixing of the mixer 123 is amplified by the IF amplifier 124.

Since mixing of the mixer 123 causes a high frequency signal of the GHz order to be generated along with the IF signal, the IF amplifier 124 amplifies this high frequency signal along with the IF signal. The IF filter 125 passes through the IF signal and removes the high frequency signal (accurately, attenuated to be equal to or less than a predetermined level). The IF signal which passes through the IF filter 125 is converted into a digital signal by the A/D converter (ADC) 126.

The baseband processing unit 13 includes a digital signal processor (DSP) 131, a central processing unit (CPU) 132, a static random access memory (SRAM) 133, and a real-time clock (RTC) 134. The baseband processing unit 13 performs various types of processing by using the oscillation signal of the TCXO 14 as a clock signal.

The DSP 131 and the CPU 132 demodulates a baseband signal from the IF signal, obtains orbit information or time information which is included in a navigation message, and performs processing of the normal positioning mode or processing of the position fixed mode, while cooperating with each other.

The SRAM 133 is used for storing the time information or the orbit information which is obtained, position information of the reception point which is set in accordance with a predetermined control command (control command for setting a position), an elevation angle mask used in, for example, the position fixed mode, and the like. The RTC 134 generates a timing for performing baseband processing. A value of the RTC 134 is counted up by using a clock signal from the TCXO 14.

Specifically, the baseband processing unit 13 generates a local code having a pattern the same as each C/A code, and performs processing (satellite searching) of obtaining correlation between each C/A code included in the baseband signal, and the local code. The baseband processing unit 13 adjusts a timing of generating the local code such that a correlation value with respect to each of local codes becomes a peak. In a case where the correlation value is equal to or greater than a threshold value, the baseband processing unit 13 determines that synchronization with a GPS satellite 2 of which the local code corresponds to the C/A code is performed (the GPS satellite 2 is acquired). In the GPS, a code division multiple access (CDMA) method is employed. In the CDMA method, all GPS satellites 2 transmit satellite signals having the same frequency, by using different C/A codes. Accordingly, the C/A code included in the received satellite signal is determined and thus an acquirable GPS satellite 2 may be searched for.

The baseband processing unit 13 performs processing of mixing a local code having the same pattern as the C/A code of the acquired GPS satellite 2, with the baseband signal in order to obtain orbit information or time information of the acquired GPS satellite 2. A signal obtained by mixing includes a navigation message which includes the orbit information or the time information of the acquired GPS satellite 2 and is demodulated. The baseband processing unit 13 performs processing of obtaining the orbit information or the time information included in the navigation message, and storing the obtained information in the SRAM 133.

The baseband processing unit 13 receives a predetermined control command (specifically, control command for setting a mode), and performs setting of either of the normal positioning mode and the position fixed mode. In the normal positioning mode, the baseband processing unit 13 performs positioning calculation by using pieces of the orbit information and the time information of four or more GPS satellites 2, which are stored in the SRAM 133.

In the position fixed mode, the baseband processing unit 13 outputs 1 PPS which is high precise, by using pieces of orbit information of one GPS satellites 2 or more, which are stored in the SRAM 133, and the position information of the reception point stored in the SRAM 133. Specifically, the baseband processing unit 13 includes an 1-PPS counter in a portion of the RTC 134. The 1-PPS counter counts a timing of generating a pulse at 1 PPS. The baseband processing unit 13 calculates a propagation delay period required for causing a satellite signal transmitted from the GPS satellite 2 to reach the reception point, by using the orbit information of the GPS satellite 2 and the position information of the reception point. The baseband processing unit 13 changes a setting value of the 1-PPS counter to the optimum value based on the calculated propagation delay period.

In the normal positioning mode, the baseband processing unit 13 may output 1 PPS based on the time information of the reception point obtained through the positioning calculation. In the position fixed mode, if a plurality of GPS satellites 2 is acquired, the positioning calculation may be performed.

The baseband processing unit 13 outputs NMEA data which includes various types of information such as the position information or the time information obtained as results of the positioning calculation, and a reception status (the number of acquired GPS satellites 2, intensity of the satellite signal, and the like).

An operation of the GPS receiver 10 configured as described above is controlled by the processing unit (CPU) 20 illustrated in FIG. 1.

The processing unit (an example of a satellite signal reception control device) 20 transmits various control commands to the GPS receiver 10 so as to control the operation of the GPS receiver 10. The processing unit 20 receives the 1 PPS or the NMEA data which is output by the GPS receiver 10, and performs various types of processing. The processing unit 20 may perform various types of processing in accordance with, for example, a program stored in a certain memory.

The processing unit 20 includes a phase comparator 21, a loop filter 22, a digital signal processor (DSP) 23, a divider 24, a GPS control unit 25, a frequency abnormality determination unit 27, and a determination unit 28. At least two of the DSP 23, the GPS control unit 25, the frequency abnormality determination unit 27, and the determination unit 28 may be configured in one component.

The DSP 23 (an example of a position information generation unit) obtains NMEA data from the GPS receiver 10 periodically (for example, for each second). The DSP 23 collects pieces of position information (result of the positioning calculation in the normal positioning mode by the GPS receiver 10) included in pieces of NMEA data, and creates statistical information for a predetermined period. The DSP 23 performs processing of generating position information of the reception point based on the created statistical information.

The GPS control unit 25 transmits various control commands to the GPS receiver 10 so as to control an operation of the GPS receiver 10. Specifically, the GPS control unit 25 transmits a control command for setting a mode to the GPS receiver 10, and performs processing of causing the mode of the GPS receiver 10 to be switched from the normal positioning mode to the position fixed mode. Before the GPS control unit 25 switches the mode of the GPS receiver 10 from the normal positioning mode to the position fixed mode, the GPS control unit 25 transmits a control command for setting a position to the GPS receiver 10, and performs processing of setting the position information of the reception point, which has been generated by the DSP 23, in the GPS receiver 10.

The divider 24 performs f-division on the clock signal (frequency: f) which is output by the atomic oscillator 30, so as to output a division clock signal of 1 Hz.

The phase comparator 21 compares 1 PPS (reference timing signal) output by the GPS receiver 10, and a division clock signal (clock signal) of 1 Hz, which is output by the divider 24. A phase difference signal as a comparison result of the phase comparator 21 is input to the atomic oscillator 30 through the loop filter 22. Parameters of the loop filter 22 are set by the DSP 23.

The division clock signal of 1 Hz output by the divider 24 is synchronized with 1 PPS output by the GPS receiver 10. The timing signal generation device 1 outputs the division clock signal as 1 PPS which has been synchronized with the UTC and has very high frequency accuracy, to the outside of the device 1. The timing signal generation device 1 outputs the latest NMEA data outwardly for each second, with synchronization with 1 PPS.

The atomic oscillator 30 is an oscillator that enables an output of a clock signal having high frequency accuracy by using atomic energy transition of, for example, a rubidium atom or a cesium atom. Examples of the atomic oscillator 30 may include an atomic oscillator using an electromagnetically induced transparency (EIT) phenomenon (may be also referred to as "a coherent population trapping (CPT) phenomenon), an atomic oscillator using an optical microwave double resonance phenomenon, and the like. The timing signal generation device 1 also outputs a clock signal which is output by the atomic oscillator 30 and has a frequency of f, to the outside of the device 1.

In the embodiment, the atomic oscillator 30 includes two atomic oscillators 30a and 30b, and one of these oscillators is appropriately selected and used. Regardless of whether or not either of the atomic oscillators 30a and 30b is selected, the atomic oscillators 30a and 30b output a clock signal, and perform switching of an output of the atomic oscillator 30 so as to cause a clock signal of the selected atomic oscillator to be input to the divider 24. For example, in a case where a clock signal of one of the atomic oscillators 30a and 30b is output as an output signal of the atomic oscillator 30, and the one atomic oscillator is inoperable due to an influence of disturbance, failure, or the like, an output of the atomic oscillator 30 is performed by performing switching to a clock signal of another atomic oscillator. Thus, it is possible to improve robust characteristics of the timing signal generation device 1. The switching may be automatically or manually performed by the processing unit 20. In a case where the processing unit 20 performs such switching, the switching may be performed in accordance with, for example, a determination result of the determination unit 28 (which will be described later).

The principle of an atomic oscillator using the EIT phenomenon will be simply described below.

Figure 3:
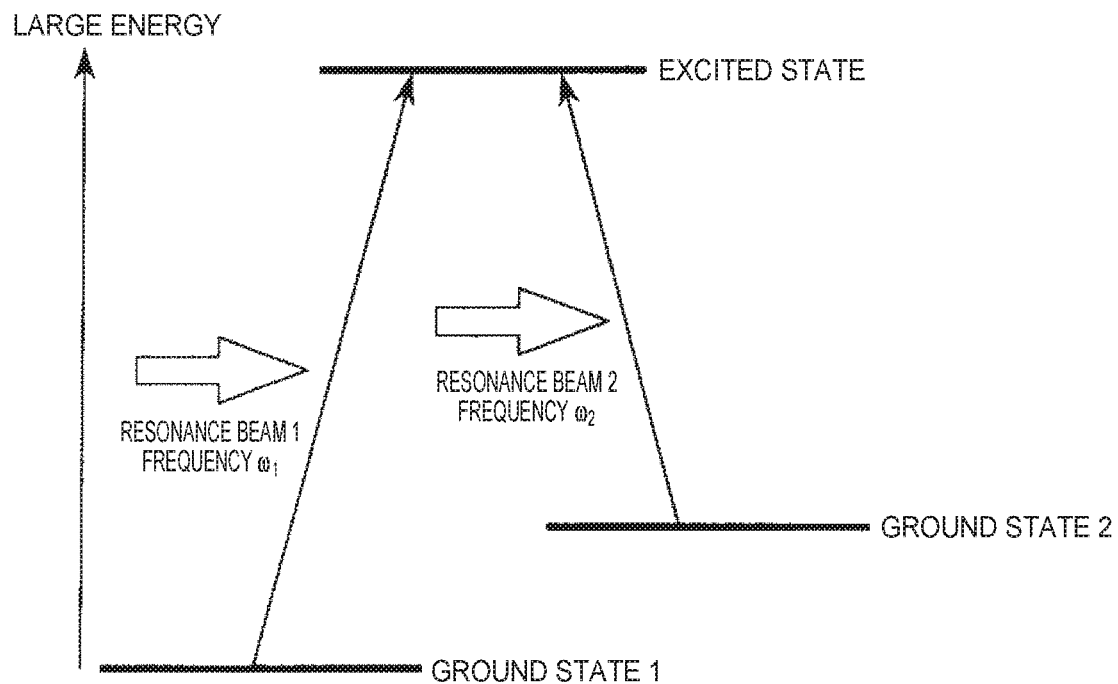
FIG. 3 is a diagram illustrating an energy state of alkali metal in an atomic oscillator which is included in the timing signal generation device illustrated in FIG. 1.
Figure 4:
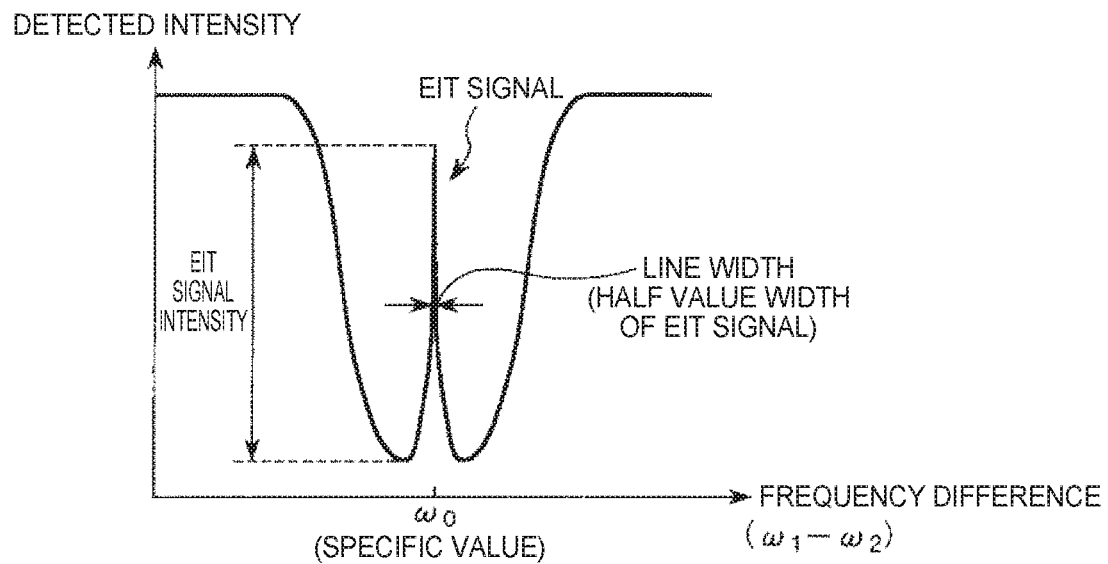
FIG. 4 is a graph illustrating a relationship between a frequency difference of two light beams which are emitted from a light source unit, and intensity of light detected by the light receiving unit, in the atomic oscillator which is included in the timing signal generation device illustrated in FIG. 1.

FIG. 3 is a diagram illustrating an energy state of alkali metal in the atomic oscillator which is included in the timing signal generation device illustrated in FIG. 1. FIG. 4 is a graph illustrating a relationship between a frequency difference and intensity in the atomic oscillator which is included in the timing signal generation device illustrated in FIG. 1. The frequency difference is a frequency difference between two light beams emitted from the light source unit. The intensity is intensity of light detected by the light receiving unit.

As illustrated in FIG. 3, alkali metal has three energy levels, and may obtain three states, that is, two ground states (ground states 1 and 2) which have different energy levels, and an excited state. Here, the ground state 1 is an energy state lower than the ground state 2.

When the gaseous alkali metal as described above is irradiated with two types of resonance beams 1 and 2 (pair of resonance beams) which have a frequency different from each other, light absorption rates (light transmittances) of the resonance beams 1 and 2 in the alkali metal vary depending on a difference ($\omega_1 - \omega_2$) between a frequency $\omega_1$ of the resonance beam 1 and a frequency $\omega_2$ of the resonance beam 2.

When the difference ($\omega_1 - \omega_2$) between the frequency $\omega_1$ of the resonance beam 1 and the frequency $\omega_2$ of the resonance beam 2 matches with a frequency corresponding to an energy difference between the ground state 1 and the ground state 2, excitation from the ground states 1 and 2 to the excited state is stopped. At this time, either of the resonance beams 1 and 2 is not absorbed in the alkali metal, but is transmitted. Such a phenomenon is referred to as the CPT phenomenon or the electromagnetically induced transparency (EIT) phenomenon.

For example, if the frequency $\omega_1$ of the resonance beam 1 is fixed and the frequency $\omega_2$ of the resonance beam 2 is changed, when the difference ($\omega_1 - \omega_2$) between the frequency $\omega_1$ of the resonance beam 1 and the frequency $\omega_2$ of the resonance beam 2 matches with the frequency $\omega_0$ corresponding to an energy difference between the ground state 1 and the ground state 2, intensity of the resonance beams 1 and 2 which are transmitted through the alkali metal is rapidly increased, as illustrated in FIG. 4. Such a steep signal is detected as an EIT signal. The EIT signal has a unique value determined based on the type of the alkali metal. Accordingly, it is possible to constitute an oscillator having high precision, by using such an EIT signal as a reference signal.

The atomic oscillator 30 is configured so as to finely adjust a frequency in accordance with an output voltage (control voltage) of the loop filter 22. As described above, the phase comparator 21, the loop filter 22, the DSP 23, and the divider 24 cause a clock signal output by the atomic oscillator 30 to be completely synchronized with 1 PPS output by the GPS receiver 10. That is, the phase comparator 21, the loop filter 22, the DSP 23, and the divider 24 constitute a phase locked loop (PLL) circuit, and function as "a synchronization control unit" that synchronizes the clock signal output by the atomic oscillator 30 with 1 PPS. Because the single atomic oscillator 30 has frequency-temperature characteristics which are not flat, a temperature sensor 41 that detects the temperature of the atomic oscillator 30 is disposed in the vicinity of the atomic oscillator 30. The DSP 23 adjusts an output voltage of the phase comparator 21 in accordance with a detection value (detected temperature) of the temperature sensor 41, and thus performs processing of temperature compensation for the frequency-temperature characteristics of the atomic oscillator 30.

If a situation (hold-over) where reception of a satellite signal by the GPS receiver 10 is not possible occurs, the precision of 1 PPS output by the GPS receiver 10 is lowered or the output of 1 PPS by the GPS receiver 10 is suspended. In such a case, the processing unit 20 may suspend processing of synchronizing the clock signal output by the atomic oscillator 30 with 1 PPS output by the GPS receiver 10, so as to cause the atomic oscillator 30 to perform self-running oscillation. With such an operation, the timing signal generation device 1 can output 1 PPS having high frequency accuracy by self-running oscillation of the atomic oscillator 30, even when the precision of 1 PPS output by the GPS receiver 10 is lowered. When a crystal oscillator such as an oven controlled crystal oscillator (OCXO) of a double oven type or single oven type, a voltage controlled crystal oscillator (VCXO), and a crystal oscillation circuit (TCXO) having an attached temperature compensation circuit is used instead of the atomic oscillator 30, it is possible to output 1 PPS having high frequency accuracy, by self-running oscillation.

In the PLL circuit which includes the above-described atomic oscillator 30, in a case where the atomic oscillator 30 fails, a phase shift between the clock signal of the atomic oscillator 30 and 1 PPS (reference timing signal) of the GPS receiver 10 occurs (phase shift becomes larger), and an output (phase difference signal) of the phase comparator 21 is increased. Accordingly, it is possible to detect failure in the atomic oscillator 30, based on the output of the phase comparator 21. In the embodiment, the frequency abnormality determination unit 27 determines whether or not the frequency of the clock signal of the atomic oscillator 30 is abnormal, by using a comparison result of the phase comparator 21. In a case where the frequency is abnormal, the frequency abnormality determination unit 27 outputs frequency abnormality information including a determination result.

However, even when the atomic oscillator 30 does not fail in practice, phase shift between the clock signal of the atomic oscillator 30 and 1 PPS (reference timing signal) of the GPS receiver 10 may occur due to an influence of disturbance such as a microwave, a power noise, resonance, and a change of the temperature. Thus, if it is assumed that failure in the atomic oscillator 30 is detected based on only the output of the phase comparator 21, that is, by using only the determination result of the frequency abnormality determination unit 27, it may be determined that the atomic oscillator 30 fails, even when the atomic oscillator 30 does not fail in practice. Even though atomic oscillator 30 fails in practice, determination of whether the atomic oscillator fails or other components fail, based on only the determination result of the frequency abnormality determination unit 27 is not possible. Thus, even when only the determination result of the frequency abnormality determination unit 27 is reported, regardless of no need of maintenance, repair, or the like, a worker is required to visit a place for maintenance, repair, or the like. In addition, when the maintenance, the repair, or the like is necessary, a long period is also required for specifying a place for which maintenance, repair, or the like is needed. Thus, efficiency of a work such as the maintenance and the repair is deteriorated.

In the timing signal generation device 1, the sensor unit 40 including the temperature sensor 41, the microwave receiver 42, the power noise sensor 43, and the resonance sensor 44, which are used for detecting disturbance, as described above, is provided. Thus, the determination unit 28 determines a cause of the frequency abnormality by using only the determination result of the frequency abnormality determination unit 27, but also a detection result of the sensor unit 40.

Determination of the frequency abnormality and determination of a cause thereof will be described below in detail.

As described above, the frequency abnormality determination unit 27 determines whether or not the frequency of the clock signal of the atomic oscillator 30 is abnormal, by using the comparison result of the phase comparator 21, and outputs frequency abnormality information including a determination result. More specifically, for example, when an output of the phase comparator 21 is equal to or greater than a predetermined set value, the frequency abnormality determination unit 27 determines that the frequency of the clock signal of the atomic oscillator 30 is abnormal (state where so-called frequency jump or frequency shift occurs), and outputs a determination result.

Preferably, the frequency abnormality determination unit 27 performs the above-described determination for each time interval in accordance with a time constant of the loop filter 22 (for example, time length of tens of cycles to thousands of cycles of the reference timing signal), and outputs a determination result for each time interval. Thus, it is possible to reduce a probability of determining fluctuation of the output of the phase comparator 21 occurring with control of the PLL circuit which includes the atomic oscillator 30, to be the frequency abnormality.

The frequency abnormality determination unit 27 performs the above-described determination multiple times for each predetermined interval. In a case where the frequency abnormality determination unit 27 determines the frequency to be abnormal consecutively a predetermined number of times or more (for example, twice or three times), it is preferable that the frequency abnormality determination unit 27 outputs a determination result indicating that the frequency is abnormal. With this operation, it is possible to reduce a probability of determining the fluctuation of the output of the phase comparator 21 occurring with the control of the PLL circuit which includes the atomic oscillator 30, as the frequency abnormality.

The sensor unit 40 detects environment information which has an influence on the comparison result of the phase comparator 21. In the embodiment, the sensor unit 40 includes the temperature sensor 41, the microwave receiver 42, the power noise sensor 43, and the resonance sensor 44.

The temperature sensor 41 has a function of detecting the temperature of the atomic oscillator 30. Thus, environment information detected by the sensor unit 40 includes information regarding the detected temperature. The temperature sensor 41 includes a thermocouple, a thermister, or the like, for example.

The oscillator such as the atomic oscillator 30 generally has temperature characteristics, and control of correcting the temperature characteristics is performed for the oscillator. However, for example, if an environmental temperature is rapidly changed, the correction is not suitably applied and thus the frequency jump easily occurs. Thus, the determination unit 28 may determine that the frequency jump occurring by the environmental temperature is included as the cause of the frequency abnormality, by using such a detection result of the environmental temperature.

The microwave receiver 42 has a function of detecting a microwave of frequency $\omega_0$ (for example, about 9.2 GHz in a case where a metal atom is a cesium atom) corresponding to an energy difference between two ground levels of the metal atom in an atomic cell. Thus, the environment information detected by the sensor unit 40 includes information regarding the microwave. The microwave receiver 42 includes an antenna that resonates at the frequency $\omega_0$, and an amplifier that amplifies a microwave received by the antenna.

If the microwave of the frequency $\omega_0$ corresponding to the energy difference between two ground levels of the metal atom in the atomic cell is input as disturbance, so-called frequency jump easily occurs in the atomic oscillator 30 (30a and 30b). For example, as described above, in the timing signal generation device 1 according to the embodiment, a plurality of atomic oscillators 30a and 30b is provided and robust characteristics are improved by switching the plurality of atomic oscillators, if necessary. In such a case, a microwave due to an output signal of another atomic oscillator may be input to the atomic oscillator in the process of being used, and the frequency jump may occur. Thus, it is possible to cause the determination unit 28 to determine that the frequency jump occurring due to the microwave is included as the cause of the frequency abnormality, by using a detection result of such a microwave.

The power noise sensor 43 has a function of detecting a power noise. The power noise is a noise occurring in the power source circuit 60 and a power supply path thereof. The power source circuit 60 supplies the power to each of the components in the timing signal generation device 1. Thus, the environment information detected by the sensor unit 40 includes information regarding the power noise. The power noise sensor 43 includes a coil, for example.

If the power noise is input as the disturbance, the frequency jump easily occurs in the oscillator such as the atomic oscillator 30. Thus, it is possible to cause the determination unit 28 to determine that the frequency jump occurring due to the power noise is included as the cause of the frequency abnormality, by using a detection result of such a power noise.

The resonance sensor 44 has a function of detecting resonance which is received the atomic oscillator 30. Thus, the environment information detected by the sensor unit 40 includes information regarding the resonance. The resonance sensor 44 includes a three-axis acceleration sensor or a three-axis gyro sensor, for example.

If the resonance is input as the disturbance, the frequency jump easily occurs in the oscillator such as the atomic oscillator 30. Thus, it is possible to cause the determination unit 28 to determine that the frequency jump occurring due to the resonance is included as the cause of the frequency abnormality, by using a detection result of such resonance.

The determination unit 28 determines a cause of abnormality in frequency of the clock signal of the atomic oscillator 30, by using the frequency abnormality information of the frequency abnormality determination unit 27 and the environment information of the sensor unit 40.

The determination unit 28 has a function as "an output unit" that outputs a determination result. For example, the output is input to a display device (not illustrated) or is transmitted to other external devices through a communication line. Thus, it is possible to cause a user of the device or a worker for maintenance or the like to recognize frequency abnormality and a cause of the frequency abnormality, and to improve efficiency of a work such as the maintenance or the repair.

The determination unit 28 outputs, for example, status information as follows, as a determination result.

TABLE 1

| | | Detection of microwave | Detection of power noise | Detection of resonance | Detection of rapid temperature change |
|---|---|---|---|---|---|
| Frequency abnormality period | Less than 1 sec | F jump (microwave disturbance) | F jump (power noise) | F jump (resonance) | F jump (temperature change) |
| | 1 sec or more | F shift (microwave disturbance) | F shift (power noise) | F shift (resonance) | F shift (temperature change) |

As shown in Table 1, in a case where the length of time when frequency abnormality information including a determination result which indicates that the frequency of the clock signal of the atomic oscillator 30 is abnormal is output from the frequency abnormality determination unit 27 is equal to or longer than a predetermined period (for example, 1 second), it is determined that the frequency abnormality corresponds to frequency shift (F shift). Thus, it is possible to cause a worker and the like to recognize a cause of failure based on a determination result, if the failure occurs in the atomic oscillator 30 or the like.

In a case where the length of time when frequency abnormality information including a determination result which indicates that the frequency of the clock signal of the atomic oscillator 30 is abnormal is output from the frequency abnormality determination unit 27 is less than the predetermined period (for example, 1 second), it is determined that the frequency jump (F jump) is included in the frequency abnormality. Thus, it is possible to cause a worker and the like to recognize whether failure occurs in a component other than the atomic oscillator 30 or to recognize a cause if the frequency jump temporarily occurs due to the disturbance, based on a determination result.

A determination result based on a detection result of the temperature sensor 41, the microwave receiver 42, the power noise sensor 43, and the resonance sensor 44 is added to the status information in addition to a determination result indicating that such frequency jump or frequency shift occurs.

Specifically, in a case where the temperature fluctuates largely (for example, up to 5° C. or higher) for a short term (for example, 1 second to 10 seconds), based on the detection result of the temperature sensor 41, a determination result indicating the above message (rapid temperature change) is added to the status information. In addition, transition information of the temperature during a period when the frequency abnormality occurs may be added to the status information.

In a case where a microwave of the frequency $\omega_0$ is input as disturbance, based on a detection result of the microwave receiver 42, the determination result indicating the above message (microwave disturbance) is added to the status information.

In a case where a power noise is input as disturbance, based on a detection result of the power noise sensor 43, the determination result indicating the above message (power noise) is added to the status information.

In a case where resonance is input as disturbance, based on a detection result of the resonance sensor 44, the determination result indicating the above message (resonance) is added to the status information.

According to the above-described timing signal generation device 1, the determination unit 28 determines a cause of the frequency abnormality by using only the determination result of the frequency abnormality determination unit 27, but also a detection result of the sensor unit 40. Thus, it is possible to recognize a cause of abnormality of the clock signal of the atomic oscillator 30. As a result, it is possible to improve the efficiency of a work such as the maintenance or the repair.

2. Electronic Device

Next, an embodiment of an electronic device according to the invention will be described.

Figure 5:
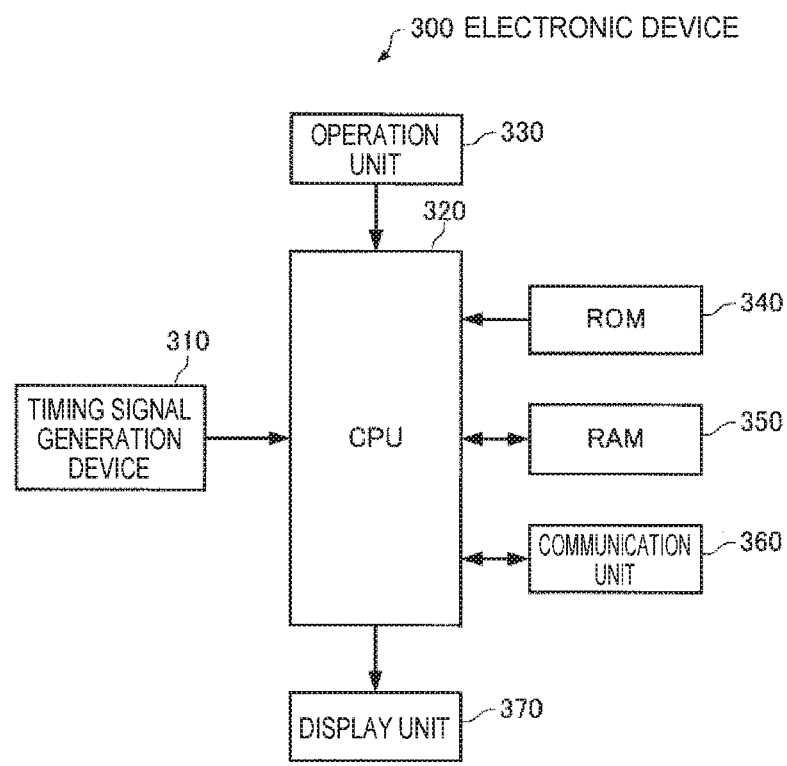
FIG. 5 is a block diagram illustrating an embodiment of an electronic device according to the invention.

FIG. 5 is a block diagram illustrating the embodiment of the electronic device according to the invention.

The electronic device 300 illustrated in FIG. 5 includes a timing signal generation device 310, a central processing unit (CPU) 320, an operation unit 330, a read only memory (ROM) 340, a random access memory (RAM) 350, a communication unit 360, and a display unit 370.

The timing signal generation device 310 is applied as the above-described timing signal generation device 1, for example. As described before, the timing signal generation device 310 receives a satellite signal and generates a timing signal (1 PPS) having high precision, and outputs the generated timing signal outwardly. Thus, it is possible to realize the electronic device 300 with lower cost and high reliability.

The CPU 320 performs various types of calculation processing or control processing, in accordance with a program stored in the ROM 340 and the like. Specifically, the CPU 320 performs types of processing with synchronization with the timing signal (1 PPS) or a clock signal which is output by the timing signal generation device 310. Examples of the performed processing include clocking processing, various types of processing performed in accordance with an operation signal from the operation unit 330, processing of controlling the communication unit 360 so as to perform data communication with the outside of the electronic device, and processing of transmitting a display signal so as to display various types of information about the display unit 370.

The operation unit 330 is an input device configured by operation keys, button switches, or the like. The operation unit 330 outputs an operation signal to the CPU 320 in accordance with an operation by a user.

The ROM 340 stores a program, data, or the like required for causing the CPU 320 to perform various types of calculation processing or control processing.

The RAM 350 is used as a work area of the CPU 320. The RAM 350 temporarily stores a program or data which has been read from the ROM 340, data input from the operation unit 330, computation results obtained by performing of the CPU 320 in accordance with various programs, and the like.

The communication unit 360 performs various types of processing for establishing data communication between the CPU 320 and an external device.

The display unit 370 is a display device configured by a liquid crystal display (LCD) and the like. The display unit 370 displays various types of information based on a display signal input from the CPU 320. A touch panel that functions as the operation unit 330 may be provided in the display unit 370.

Various electronic devices are considered as such an electronic device 300, and the electronic device 300 is not particularly limited. For example, a server (time server) for managing points of time, in which synchronization with a reference point of time is realized, a time management device (time stamp server) that performs issue of a time stamp, and the like, a frequency reference device such as a base station are exemplified.

3. Moving Object

Figure 6:
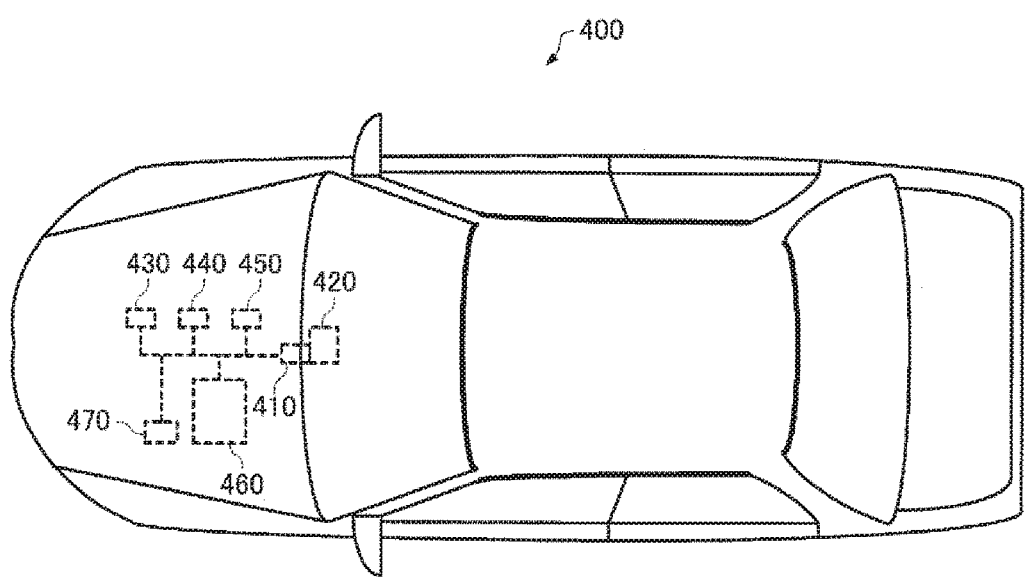
FIG. 6 is a diagram illustrating an embodiment of a moving object according to the invention.

FIG. 6 is a diagram illustrating an embodiment of the moving object according to the invention.

A moving object 400 illustrated in FIG. 6 includes a timing signal generation device 410, a car navigation device 420, controllers 430, 440, and 450, a battery 460, and a backup battery 470.

The above-described timing signal generation device 1 may be applied as the timing signal generation device 410. The timing signal generation device 410 performs the positioning calculation in real-time in the normal positioning mode, and outputs 1 PPS, a clock signal, and NMEA data, for example, when the moving object 400 is moving. For example, when the moving object 400 stops, the timing signal generation device 410 performs the positioning calculation a plurality of times in the normal positioning mode. Then, the timing signal generation device 410 sets the most frequent value or the median value of results obtained by performing the positioning calculation the plurality of times, as the current position information, and outputs 1 PPS, a clock signal, and NMEA data in the position fixed mode.

The car navigation device 420 is synchronized with 1 PPS or the clock signal which is output by the timing signal generation device 410, and displays the position or the point of time thereof, or other various types of information about a display by using the NMEA data which is output by the timing signal generation device 410.

The controllers 430, 440, and 450 perform various controls for an engine system, a brake system, a keyless entry system, and the like. The controllers 430, 440, and 450 may perform various controls with synchronization with a clock signal output by the timing signal generation device 410.

The moving object 400 in the embodiment includes the timing signal generation device 410, and thus it is possible to ensure high reliability in the middle of moving and stopping.

Various moving objects are considered as such a moving object 400. Examples of the moving object 400 include an automobile (also including an electric automobile), an aircraft such as a jet aircraft or a helicopter, a watercraft, a rocket, a satellite, and the like.

Hitherto, the timing signal generation device, the electronic device, and the moving object according to the invention are described based on the embodiment illustrated in the drawings. However, the invention is not limited thereto.

The configuration in the embodiment of the invention may be substituted with any configuration showing similar functions of the above-described embodiment. Any other constituents may be added.

In the above-described embodiment, a timing signal generation device using a GPS is exemplified. However, the timing signal generation device may use a global navigation satellite system (GNSS) except for the GPS, that is, for example, Galileo, GLONASS, or the like.

In the above-described embodiment, the descriptions are made by using a case where the sensor unit includes a temperature sensor, a microwave receiver, a power noise sensor, and a resonance sensor, as an example. However, if the sensor unit includes at least one of these sensors, other sensor may be omitted. The sensor included in the sensor unit is not limited to the above descriptions as long as a sensor enables detect an environment (disturbance) having an influence on an output result of the phase comparator. For example, a barometer sensor, a photo sensor, and the like may be used as the sensor.

What is claimed is:

1. A timing signal generation device comprising:
 a reference-timing signal generator that outputs a reference timing signal;
 an oscillator that outputs a clock signal for synchronization with the reference timing signal;
 a phase comparator that compares the reference timing signal and the clock signal in phase;
 a first determiner that determines whether or not a frequency of the clock signal is abnormal, by using a comparison result of the phase comparator, and outputs frequency abnormality information including a determination result;

at least one sensor that detects environment information; and a second determiner that determines a cause of the abnormality, by using the frequency abnormality information and the environment information, wherein the at least one sensor includes a resonance sensor that enables detection of resonance received by the oscillator, and the environment information includes information regarding the resonance.

2. The timing signal generation device according to claim 1, wherein the oscillator is an atomic oscillator.

3. The timing signal generation device according to claim 2, wherein the atomic oscillator oscillates based on energy transition in a metal atom which has two ground levels different from each other, the at least one sensor includes a microwave receiver that enables detection of a microwave having a frequency which corresponds to an energy difference between the two ground levels, and the environment information includes information regarding the microwave.

4. The timing signal generation device according to claim 1, wherein the at least one sensor includes a power noise sensor that enables detection of a power noise, and the environment information includes information regarding the power noise.

5. The timing signal generation device according to claim 1, wherein the at least one sensor includes a temperature sensor that enables detection of the temperature of the oscillator, and the environment information includes information regarding the temperature.

6. The timing signal generation device according to claim 1, further comprising:

an output that outputs a determination result of the second determiner.

7. The timing signal generation device according to claim 1, wherein the reference-timing signal generator is a GPS receiver.

8. An electronic device comprising:

the timing signal generation device according to claim 1; and a processor that performs processing with synchronization with the clock signal or a timing signal from the timing signal generation device.

9. A moving object comprising:

the timing signal generation device according to claim 1; and a navigation device that is synchronized with the clock signal or a timing signal from the timing signal generation device.

10. A timing signal generation device comprising:

a reference-timing signal generator that outputs a reference timing signal;

an oscillator that outputs a clock signal for synchronization with the reference timing signal;

a phase comparator that compares the reference timing signal and the clock signal in phase;

a first determiner that determines whether or not a frequency of the clock signal is abnormal, by using a comparison result of the phase comparator, and outputs frequency abnormality information including a determination result;

at least one sensor that detects environment information; and a second determiner that determines a cause of the abnormality, by using the frequency abnormality information and the environment information, wherein the at least one sensor includes a power noise sensor that enables detection of a power noise, and the environment information includes information regarding the power noise.

11. The timing signal generation device according to claim 10, wherein the oscillator is an atomic oscillator.

12. The timing signal generation device according to claim 11, wherein the atomic oscillator oscillates based on energy transition in a metal atom which has two ground levels different from each other, the at least one sensor includes a microwave receiver that enables detection of a microwave having a frequency which corresponds to an energy difference between the two ground levels, and the environment information includes information regarding the microwave.

13. The timing signal generation device according to claim 10, wherein the at least one sensor includes a temperature sensor that enables detection of the temperature of the oscillator, and the environment information includes information regarding the temperature.

14. The timing signal generation device according to claim 10, wherein the reference-timing signal generator is a GPS receiver.

15. An electronic device comprising:

the timing signal generation device according to claim 10; and a processor that performs processing with synchronization with the clock signal or a timing signal from the timing signal generation device.

16. A timing signal generation device comprising:

a reference-timing signal generator that outputs a reference timing signal;

an oscillator that outputs a clock signal for synchronization with the reference timing signal;

a phase comparator that compares the reference timing signal and the clock signal in phase;

a first determiner that determines whether or not a frequency of the clock signal is abnormal, by using a comparison result of the phase comparator, and outputs frequency abnormality information including a determination result;

at least one sensor that detects environment information; and a second determiner that determines a cause of the abnormality, by using the frequency abnormality information and the environment information, wherein the reference-timing signal generator is a GPS receiver.

17. The timing signal generation device according to claim 16, wherein the oscillator is an atomic oscillator.

18. The timing signal generation device according to claim 16,
- wherein the atomic oscillator oscillates based on energy transition in a metal atom which has two ground levels different from each other,
- the at least one sensor includes a microwave receiver that enables detection of a microwave having a frequency which corresponds to an energy difference between the two ground levels, and
- the environment information includes information regarding the microwave.

19. The timing signal generation device according to claim 16,
- wherein the at least one sensor includes a temperature sensor that enables detection of the temperature of the oscillator, and
- the environment information includes information regarding the temperature.

20. An electronic device comprising:
- the timing signal generation device according to claim 16; and
- a processor that performs processing with synchronization with the clock signal or a timing signal from the timing signal generation device.

* * * * *